United States Patent
Liu et al.

(10) Patent No.: US 10,748,940 B2
(45) Date of Patent: Aug. 18, 2020

(54) TFT SUBSTRATE HAVING DATA LINES AS TOUCH DRIVING ELECTRODE AND COMMON ELECTRODES AS TOUCH SENSING ELECTRODE AND TOUCH DISPLAY PANEL USING SAME

(71) Applicant: HON HAI PRECISION INDUSTRY CO., LTD., New Taipei (TW)

(72) Inventors: Chia-Lin Liu, New Taipei (TW); Yu-Fu Weng, New Taipei (TW); Chien-Wen Lin, New Taipei (TW); Tzu-Yu Cheng, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/820,384

(22) Filed: Nov. 21, 2017

(65) Prior Publication Data

US 2018/0145090 A1 May 24, 2018

Related U.S. Application Data

(60) Provisional application No. 62/426,303, filed on Nov. 24, 2016.

(51) Int. Cl.
| | |
|---|---|
| *G06F 3/044* | (2006.01) |
| *H01L 27/12* | (2006.01) |
| *G06F 3/041* | (2006.01) |
| *G02F 1/1343* | (2006.01) |
| *G06F 3/047* | (2006.01) |
| *G02F 1/1333* | (2006.01) |

(52) U.S. Cl.
CPC .......... *H01L 27/124* (2013.01); *G02F 1/1343* (2013.01); *G06F 3/044* (2013.01); *G06F 3/047* (2013.01); *G06F 3/0412* (2013.01); *G06F 3/0416* (2013.01); *G02F 1/13338* (2013.01)

(58) Field of Classification Search
CPC .......... G06F 2203/04107–04113; G06F 3/044
See application file for complete search history.

(56) References Cited

U.S. PATENT DOCUMENTS

| | | | |
|---|---|---|---|
| 2013/0162570 A1 | 6/2013 | Shin et al. | |
| 2014/0062943 A1* | 3/2014 | Choi | G06F 3/0412 345/174 |

(Continued)

FOREIGN PATENT DOCUMENTS

| | | |
|---|---|---|
| CN | 103902120 A | 7/2014 |
| CN | 104020904 A | 9/2014 |

(Continued)

*Primary Examiner* — Sanghyuk Park
(74) *Attorney, Agent, or Firm* — ScienBiziP, P.C.

(57) ABSTRACT

A TFT substrate for a touch display panel of reduced thickness defines a display area and a surrounding non-display area. The TFT substrate includes a first conductive layer on the substrate and a second conductive layer on the first conductive layer. In the display area, the first conductive layer includes data lines and the second conductive layer includes common electrodes. Each common electrode extends as a strip along a first direction. Each data line extends along a second direction. The first direction intersects the second direction. Each data line crosses the common electrodes. Each data line functions as a touch driving electrode and each common electrode functions as a touch sensing electrode.

12 Claims, 5 Drawing Sheets

(56) References Cited

U.S. PATENT DOCUMENTS

| | | | |
|---|---|---|---|
| 2014/0184559 A1* | 7/2014 | Han | G06F 3/0412 |
| | | | 345/174 |
| 2014/0184944 A1 | 7/2014 | Ma et al. | |
| 2015/0346860 A1 | 12/2015 | Qin | |
| 2016/0098144 A1* | 4/2016 | Yang | G06F 3/0416 |
| | | | 345/174 |
| 2016/0109992 A1* | 4/2016 | Hung | G06F 3/0412 |
| | | | 345/174 |
| 2016/0132166 A1 | 5/2016 | Kim et al. | |
| 2017/0017320 A1* | 1/2017 | Tsai | G06F 3/044 |
| 2017/0185196 A1* | 6/2017 | Kim | G06F 3/0412 |
| 2017/0249044 A1* | 8/2017 | Liu | G06F 3/0416 |

FOREIGN PATENT DOCUMENTS

| | | |
|---|---|---|
| TW | 201236127 | 9/2012 |
| TW | 201326998 | 7/2013 |

\* cited by examiner

TFT SUBSTRATE HAVING DATA LINES AS TOUCH DRIVING ELECTRODE AND COMMON ELECTRODES AS TOUCH SENSING ELECTRODE AND TOUCH DISPLAY PANEL USING SAME

FIELD

The subject matter herein generally relates to a thin film transistor (TFT) substrate and a touch display panel using the TFT substrate.

BACKGROUND

A touch display panel can include touch sensing structures. A conventional mutual capacitive touch display panel may include a plurality of touch driving electrodes and a plurality of touch sensing electrodes. However, the touch driving electrodes and the touch sensing electrodes are usually located on different layers, which does not reduce an overall thickness of the touch display panel. Therefore, there is room for improvement in the art.

BRIEF DESCRIPTION OF THE DRAWINGS

Implementations of the present technology will now be described, by way of example only, with reference to the attached figures.

DETAILED DESCRIPTION

Figure 1:
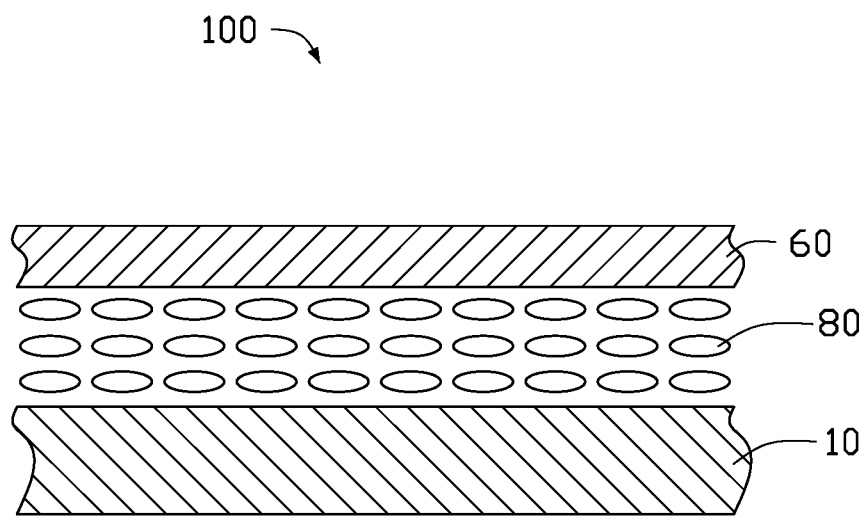
FIG. 1 is a cross sectional view of an exemplary embodiment of a touch display panel.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

A definition that applies throughout this disclosure will now be presented.

The term "comprising," when utilized, means "including, but not necessarily limited to"; it specifically indicates open-ended inclusion or membership in the so-described combination, group, series, and the like.

Referring to FIG. 1, an exemplary embodiment of a touch display panel 100 is an in-cell touch display panel. The touch display panel 100 includes a TFT substrate 10, a color filter substrate 60 facing the TFT substrate 10, a liquid crystal layer 80 between the TFT substrate 10 and the color filter substrate 60, and a plurality of conventional photo spacers (not shown) for supporting a gap between the TFT substrate 10 and the color filter substrate 60.

Figure 2:
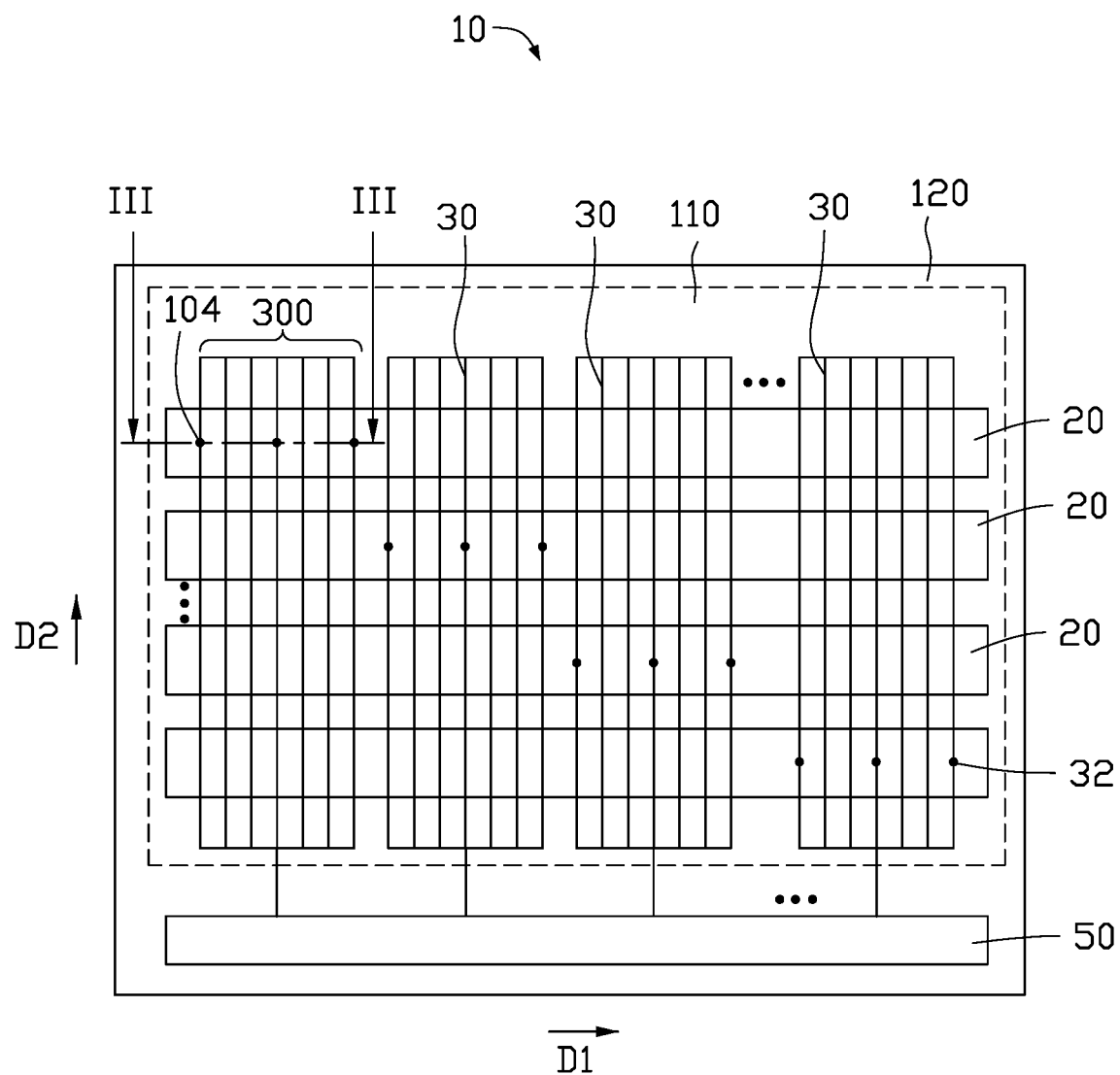
FIG. 2 is a planar view of an exemplary embodiment of a TFT substrate in the touch display panel of FIG. 1.
Figure 3:
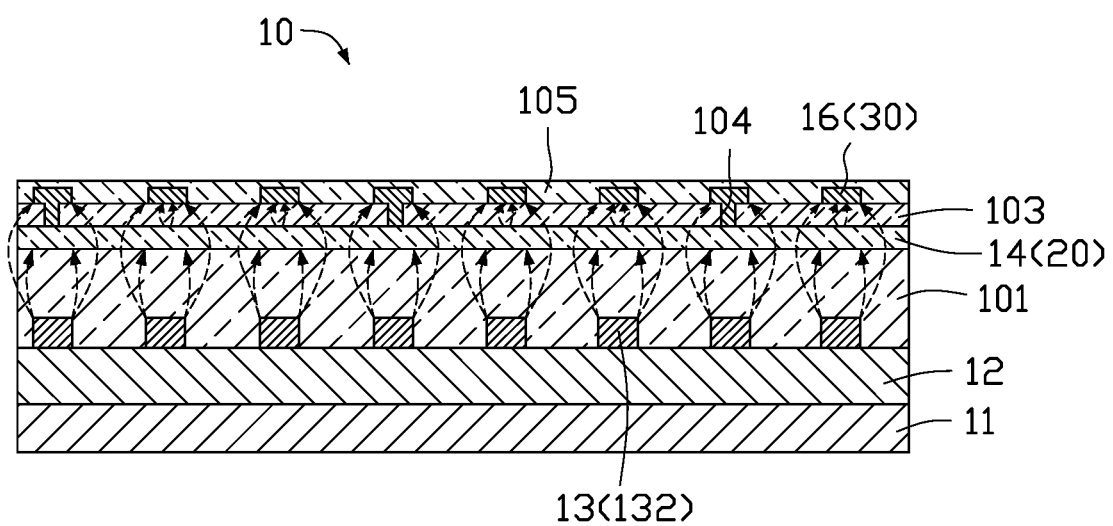
FIG. 3 is a cross sectional view of the TFT substrate in FIG. 1.

FIG. 2 through FIG. 3 illustrate the TFT substrate 10. As shown in FIG. 3, the TFT substrate 10 includes a substrate 11, a TFT layer 12 on a surface of the substrate 11, a first conductive layer 13 formed on a surface of the TFT layer 12 away from the substrate 11, a second conductive layer 14 on a surface of the first conductive layer 13 away from the substrate 11, and a third conductive layer 16 formed on a surface of the second conductive layer 14 away from the substrate 11.

As shown in FIG. 3, the TFT substrate 10 further includes a first insulating material layer 101 between the first conductive layer 13 and the second conductive layer 14, to insulate the first conductive layer 13 from the second conductive layer 14. The TFT substrate 10 further includes a second insulating material layer 103 between the second conductive layer 14 and the third conductive layer 16, to insulate the second conductive layer 14 from the third conductive layer 16. The TFT substrate 10 further includes a planarization layer 105 on the second insulating material layer 103 which covers the third conductive layer 16. The planarization layer 105 is electrically insulating.

Figure 4:
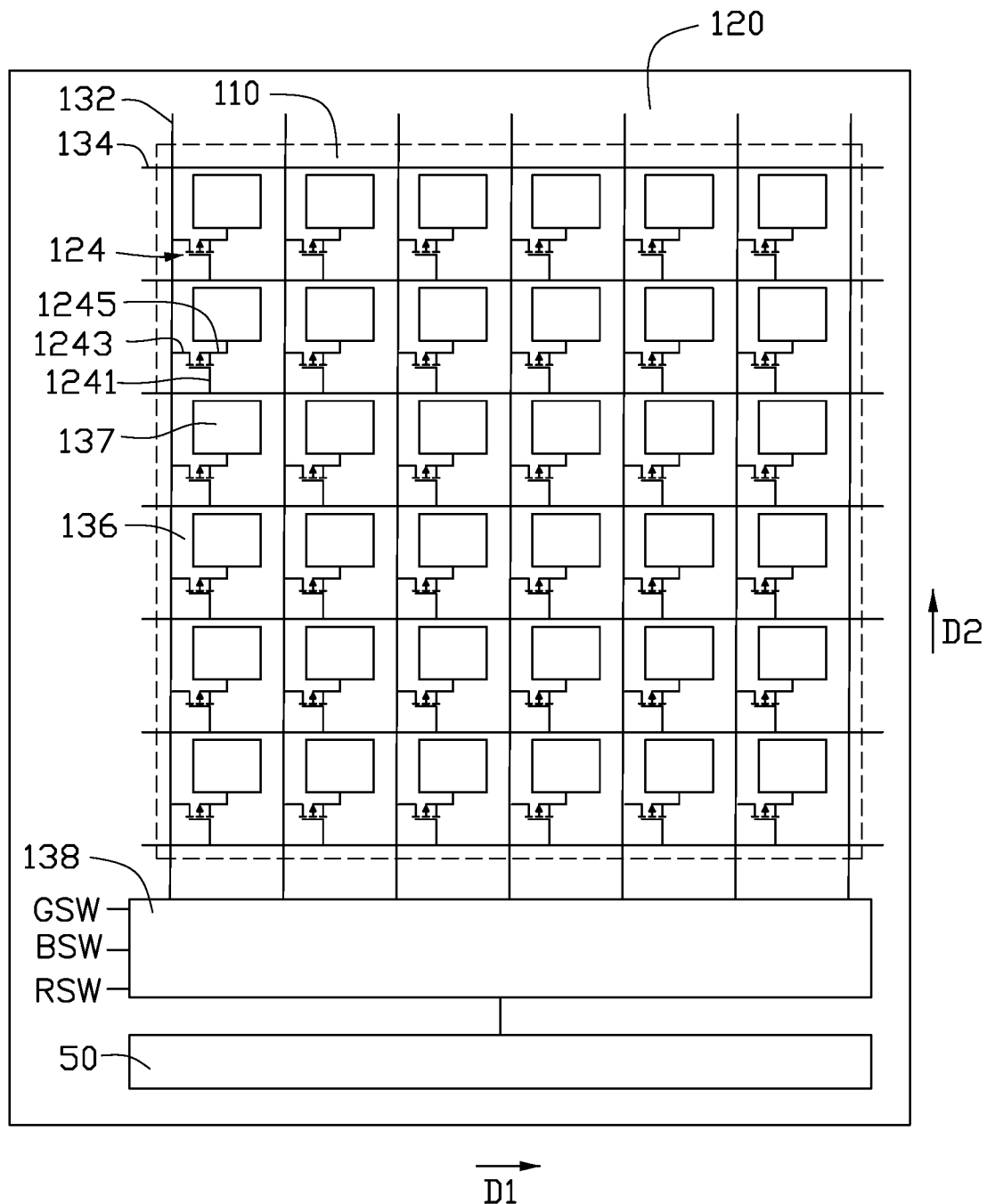
FIG. 4 is a schematic circuit diagram of the TFT substrate in FIG. 1.

The TFT layer 12 has a multilayer structure (not shown). The TFT layer 12 includes a plurality of TFTs 124 (as shown in FIG. 4). Each TFT 124 is conventional TFT in the art. As shown in FIG. 4, each TFT 124 includes a gate electrode 1241, a source electrode 1243, and a drain electrode 1245.

Referring to FIG. 2 and FIG. 3, the second conductive layer 14 is patterned to form a plurality of common electrodes 20. The second conductive layer 14 is made of a transparent conductive material. As shown in FIG. 2, each common electrode 20 extends as a strip shape along a first direction D1 shown in FIG. 2, and the plurality of common electrodes 20 is arranged in a row along the second direction D2 shown in FIG. 2. The first direction intersects the second direction. In this exemplary embodiment, the first direction is perpendicular to the second direction. It is known that the common electrodes 20 are configured to cooperate with the pixel electrode 137 (shown in FIG. 4) to form an electric field (not shown). The electric field rotates the liquid crystal molecules (not shown) in the liquid crystal layer 80. In this exemplary embodiment, the common electrodes 20 are also configured as touch sensing electrodes.

Referring to FIG. 2 and FIG. 3, the third conductive layer 16 is patterned to form a plurality of connecting wires 30. As shown in FIG. 2, each connecting wire 30 extends along the second direction D2 shown in FIG. 2, and the plurality of connecting wires 30 is arranged in a row along the first direction D1 shown in FIG. 2. Each connecting wire 30 crosses the plurality of common electrodes 20.

As shown in FIG. 2, the TFT substrate 10 defines a display area 110 and a non-display area 120 surrounding the display area 110. The plurality of common electrodes 20 is located in the display area 110. As shown in FIG. 2, the TFT substrate 10 further includes a control circuit 50 located in the non-display area 120. Each of the common electrodes 20 is electrically connected to the control circuit 50 by at least one connection wire 30. The control circuit 50 is configured to receive touch signals from the common electrode 20.

In this embodiment, as shown in FIG. 2, the plurality of connecting wires 30 is divided into a plurality of connecting wire groups 300. The plurality of connecting wire groups 300 are arranged at intervals along the first direction. Each connecting wire group 300 includes at least one connecting wire 30. In this embodiment, each connecting wire group 300 includes seven connecting wires 30. Each connecting wire group 300 is electrically connected to one common electrode 20 and is electrically insulated from other common electrodes 20. Therefore, a number of the connecting wire groups 300 is equal to a number of the common electrodes 20. One end of each connecting wire set 300 is electrically coupled to the control circuit 50, such that each common electrode 20 is electrically coupled to the control circuit 50 by one connecting wire group 300.

The connecting wires 30 in each connecting wire group 300 are electrically connected in parallel, to reduce the overall resistance of the connecting wire group 300. It can be understood that the number of the connecting wires 30 in each connection wire group 300 is not limited to seven, and may also be any number larger than one, such as two, three, or more.

Referring to FIG. 3, the second insulating material layer 103 is located on the first insulating material layer 101 and covers the common electrodes 20. The third conductive layer 16 forming the plurality of connecting wires 30 is located on the second insulating material layer 103. Some of the connecting wires 30 in the plurality of connecting wires 30 are electrically coupled to the common electrodes 20 by via holes 104. Each via hole 104 extends through the second insulating material layer 103. In this exemplary embodiment, three connecting wires 30 in each connecting wire group 300 are electrically coupled to the corresponding one common electrode 20. It can be understood that the number of the connection wires 30 in each connection wire group 300 electrically coupled to a common electrode 20 is not limited to three, and may also be one, two or more. At least one connection wire 30 must be electrically coupled to the corresponding one common electrode 20.

Referring to FIG. 3 and FIG. 4, the first conductive layer 13 is patterned to form a plurality of data lines 132. As shown in FIG. 4, each data line 132 extends along the second direction D2 shown in FIG. 4, and the plurality of data lines 132 is arranged at intervals along the first direction D1 shown in FIG. 4. Since each common electrode 20 extends along the first direction D1, each data line 132 intersects and crosses the plurality of common electrodes 20. It is known that the data lines 132 are configured to transmit data signals to the source electrodes of the TFTs. In this exemplary embodiment, the data lines 132 are also configured as touch driving electrodes.

As shown in FIG. 3, the first insulating material layer 101 is located on the TFT layer 12 and completely covers the plurality of data lines 132. The second conductive layer 14 forming the common electrodes 20 is located on the first insulating material layer 101.

As shown in FIG. 4, the TFT substrate 10 further includes a plurality of scan lines 134. Each scan line 134 extends along the first direction D1 shown in FIG. 4, and the plurality of scan lines 134 is arranged at intervals along the second direction D2 shown in FIG. 4. It is to be understood that the scan lines 134 and the data lines 132 are not located at a same layer, the scan lines 134 being formed by conductive layers other than the first conductive layer 13. The plurality of scan lines 134 is insulated from the plurality of data lines 132. The scan lines 134 and the data lines 132 intersect with each other to define pixel units 136. At least one TFT 124 and a pixel electrode 137 are located in each pixel unit 136. The gate electrode 1241 of one of the at least one TFT 124 is electrically coupled to one scan line 134, a source electrode 1243 of the one of the at least one TFT 124 is electrically coupled to one data line 132, and a drain electrode 1245 of the one of the at least one TFT 124 is electrically coupled to a pixel electrode 137.

As described above, each connecting wire 30 extends along the second direction D2 shown in FIG. 2, and each data line 132 extends along the second direction D2 shown in FIG. 4, the connecting wires 30 and the data lines 132 always being parallel. In this exemplary embodiment, a number of the connection wires 30 is equal to a number of the data lines 132. Referring to FIG. 3, in this exemplary embodiment, the connecting wires 30 and the data lines 132 are made of conductive material. A projection of each connecting wire 30 on the substrate 11 overlaps a projection of one data line 132 on the substrate 11, thus the connecting wires have no effect on the aperture ratio.

As shown in FIG. 4, the TFT substrate 10 further includes a demultiplexer 138 in the non-display area 120. The demultiplexer 138 is located between the plurality of data lines 132 and the control circuit 50. Each data line 132 is electrically coupled to the control circuit 50 by the demultiplexer 138. The demultiplexer 138 has three selection terminals, RSW, GSW, and BSW. The demultiplexer 138 outputs signals to all of the data lines 132 according to the signals of the selection terminals RSW, GSW, and BSW. Data signals or touch driving signals can be applied to the data lines 132 by the control circuit 5 and the demultiplexer 138. Several adjacent data lines 132 may be used as one touch driving electrode.

The touch display panel 100 adopts a time-division driving method. During a display period, display driving signals (e. g. a common electrode voltage) are applied to the common electrodes 20, and a data signals are applied to the data lines 132. During a touch sensing period, touch driving signals are applied to the data lines 132. The common electrodes 20 receive the touch sensing signals and transmit the touch sensing signals to the control circuit 50 by the connecting wires 30.

Figure 5:
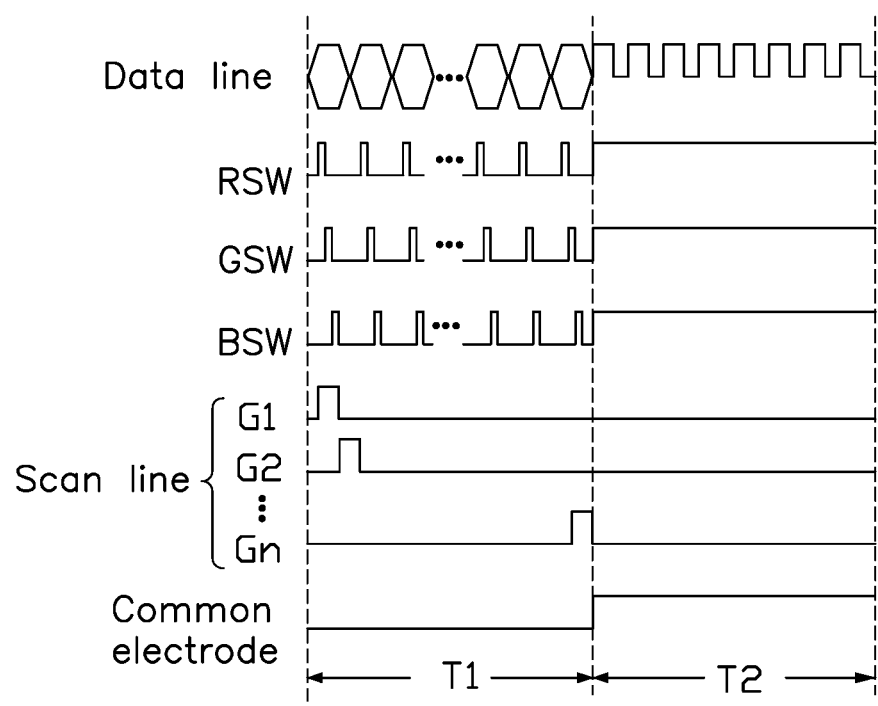
FIG. 5 is a diagrammatic view of drive-time sequence of the TFT substrate in FIG. 2 through FIG. 4.

The drive-time sequence of the TFT substrate 10 is shown in FIG. 5. The TFT substrate 10 is driven in a plurality of frame times. Each frame time includes a display period T1 and a touch sensing period T2. During the display period T1, the control signals of the three selection terminals RSW, GSW, and BSW of the demultiplexer 138 are sequentially alternating pulse signals. Data voltage signals are applied to the data lines 132, and each common electrode 20 receives a direct current voltage (common electrode voltage), each of the scan lines 134 receiving the scan signal in sequence. During the touch sensing period T2, the control signals of the three selection terminals RSW, GSW, and BSW of the demultiplexer 138 are all switched to a direct current voltage (high potential voltage), and touch driving signals (pulse signal voltages) are applied to the data lines 132. Each common electrode 20 receives a voltage which is different from the common electrode voltage (e. g. higher than the common electrode voltage in this exemplary embodiment), and scan signals stop being applied to the scan lines 134.

During the touch sensing period T2, each data line 132 functions as a touch driving electrode and each common electrode 20 functions as a touch sensing electrode, each data line 132 and one common electrode 20 forming a first mutual capacitor. Each data line 132 also cooperates with one connecting wire 30 that overlaps the data line 132 to form a second mutual capacitor. Each common electrode 20 cooperates with a connecting wires 30 that is not electrically coupled to the common electrode 20 to form a parasitic capacitor.

The TFT substrate 10 does not need to set additional electrodes functioning as the touch driving electrode and the touch sensing electrodes, thus thickness the TFT substrate can be effectively reduced.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

What is claimed is:

1. A thin film transistor (TFT) substrate defining a display area and a non-display area surrounding the display area, the TFT substrate comprising:
   a substrate;
   a first insulating material layer on the substrate;
   a first conductive layer on the substrate, the first conductive layer comprising a plurality of data lines in the display area, the plurality of data lines being covered by the first insulating material layer;
   a second conductive layer on the first insulating material layer, the second conductive layer comprising a plurality of common electrodes in the display area; and
   a control circuit in the non-display area, the plurality of data lines being electrically coupled to the control circuit to receive data signals or touch driving signals; the plurality of common electrodes being electrically coupled to the control circuit to receive touch sensing signals and transmit the touch sensing signals to the control circuit;
   wherein each of the plurality of common electrodes extends as a strip along a first direction; all of the plurality of common electrodes are arranged in a row along a second direction; the second direction intersects the first direction; each of the plurality of data lines extends along the second direction; each of the plurality of data lines crosses each of the plurality of common electrodes; the plurality of data lines and the plurality of common electrodes are electrically insulated from each other by the first insulating material layer between the plurality of data lines and the plurality of common electrodes; each of the plurality of data lines is a touch driving electrode and is applied with touch driving signals during a touch sensing period; each of the plurality of common electrodes is a touch sensing electrode; each of the plurality of data lines and each of the plurality of common electrodes forms a capacitor;
   wherein the TFT substrate further comprises a second insulating material layer on the second conductive layer and a third conductive layer on the second insulating material layer, wherein the third conductive layer comprises a plurality of connecting wires in the display area, the second insulating material layer defines a plurality of via holes extending through the second insulating material layer; each of the plurality of common electrodes is electrically coupled to at least one of the plurality of connecting wires by at least one of the plurality of via holes;
   wherein each of the plurality of connecting wires extends along the second direction; each of the plurality of connecting wires crosses the plurality of common electrodes;
   wherein the plurality of connecting wires is divided into a plurality of connecting wire groups; each of the plurality of connecting wire groups comprises at least one of the plurality of connecting wires and corresponds to one of the plurality of common electrodes; at least one connecting wire in each of the plurality of connecting wire groups is electrically coupled to one of the plurality of common electrodes and electrically insulated from other common electrodes; wherein each of the plurality of common electrodes is electrically coupled to the control circuit by one corresponding connecting wire groups.

2. The TFT substrate according to claim 1, wherein each of the plurality of connecting wire groups comprises at least two of the plurality of connecting wires, the at least two of the plurality of connecting wires in each of the plurality of connecting wire groups is electrically coupled in parallel.

3. The TFT substrate according to claim 1, wherein each of the plurality of connecting wire groups comprises at least one connecting wire that is not electrically coupled to the plurality of common electrodes.

4. The TFT substrate according to claim 1, wherein each of the plurality of connecting wires has a projection on the substrate that overlaps with a projection of one of the plurality of data lines on the substrate.

5. The TFT substrate according to claim 1, further comprising a demultiplexer in the non-display area; wherein each of the plurality of data lines is electrically coupled to the control circuit by the demultiplexer.

6. A touch display panel comprising:
   a color filter substrate; and
   a thin film transistor (TFT) substrate facing the color filter substrate; the TFT substrate defining a display area and a non-display area surrounding the display area, the TFT substrate comprising:
   a substrate;
   a first insulating material layer on the substrate;
   a first conductive layer on the substrate, the first conductive layer comprising a plurality of data lines in the display area, the plurality of data lines being covered by the first insulating material layer;
   a second conductive layer on the first insulating material layer, the second conductive layer comprising a plurality of common electrodes in the display area; and
   a control circuit in the non-display area, the plurality of data lines being electrically coupled to the control circuit to receive data signals or touch driving signals; the plurality of common electrodes being electrically coupled to the control circuit to receive touch sensing signals and transmit the touch sensing signals to the control circuit;
   wherein each of the plurality of common electrodes extends as a strip along a first direction; all of the plurality of common electrodes are arranged in a row along a second direction; the second direction intersects the first direction; each of the plurality of data lines extends along the second direction; each of the plurality of data lines crosses each of the plurality of common electrodes; the plurality of data lines and the plurality of common electrodes are electrically insulated from each other by the first insulating material layer between the plurality of data lines and the plurality of common electrodes; each of the plurality of data lines is a touch driving electrode and is applied with touch driving signals during a touch sensing period; each of the plurality of common electrodes is a touch sensing electrode; each of the plurality of data lines and each of the plurality of common electrodes forms a capacitor;
   wherein the TFT substrate further comprises a second insulating material layer on the second conductive layer and a third conductive layer on the second insulating material layer, wherein the third conductive layer comprises a plurality of connecting wires in the display area; the second insulating material layer defines a plurality of via holes extending through the second insulating material layer; each of the plurality of common electrodes is electrically coupled to at least one of the plurality of connecting wires by at least one of the plurality of via holes;

wherein each of the plurality of connecting wires extends along the second direction; each of the plurality of connecting wires crosses the plurality of common electrodes;

wherein the plurality of connecting wires is divided into a plurality of connecting wire groups; each of the plurality of connecting wire groups comprises at least one of the plurality of connecting wires and corresponds to one of the plurality of common electrodes; at least one connecting wire in each of the plurality of connecting wire groups is electrically coupled to one of the plurality of common electrodes and electrically insulated from other common electrodes;

wherein each of the plurality of common electrodes is electrically coupled to the control circuit by one corresponding connecting wire groups.

7. The touch display panel according to claim 6, wherein each of the plurality of connecting wire groups comprises at least two of the plurality of connecting wires, the at least two of the plurality of connecting wires in each of the plurality of connecting wire groups is electrically coupled in parallel.

8. The touch display panel according to claim 6, wherein each of the plurality of connecting wire groups comprises at least one connecting wire that is not electrically coupled to the plurality of common electrodes.

9. The touch display panel according to claim 6, wherein each of the plurality of connecting wires has a projection on the substrate that overlaps with a projection of one of the plurality of data lines on the substrate.

10. The touch display panel according to claim 6, further comprising a demultiplexer in the non-display area; wherein each of the plurality of data lines is electrically coupled to the control circuit by the demultiplexer.

11. A thin film transistor (TFT) substrate defining a display area and a non-display area surrounding the display area, the TFT substrate comprising:
a substrate;
a first insulating material layer on the substrate;
a first conductive layer on the substrate, the first conductive layer comprising a plurality of data lines in the display area, the plurality of data lines being covered by the first insulating material layer;
a second conductive layer on the first insulating material layer, the second conductive layer comprising a plurality of common electrodes in the display area; and
a control circuit in the non-display area, the plurality of data lines being electrically coupled to the control circuit to receive data signals or touch driving signals; the plurality of common electrodes being electrically coupled to the control circuit to receive touch sensing signals and transmit the touch sensing signals to the control circuit;

wherein each of the plurality of common electrodes extends as a strip along a first direction; all of the plurality of common electrodes are arranged in a row along a second direction; the second direction intersects the first direction; each of the plurality of data lines extends along the second direction; each of the plurality of data lines crosses each of the plurality of common electrodes; the plurality of data lines and the plurality of common electrodes are electrically insulated from each other by the first insulating material layer between the plurality of data lines and the plurality of common electrodes; each of the plurality of data lines is a touch driving electrode and is applied with touch driving signals during a touch sensing period; each of the plurality of common electrodes is a touch sensing electrode;

wherein the TFT substrate further comprises a second insulating material layer on the second conductive layer and a plurality of connecting wire groups on the second insulating material layer and in the display area;

each of the plurality of connecting wire groups comprises at least two connecting wires;

wherein each of the at least two connecting wires extends along the second direction and crosses the plurality of common electrodes;

at least one connecting wire in each of the plurality of connecting wire groups is electrically coupled to one of the plurality of common electrodes and not electrically coupled to other of the plurality of common electrodes.

12. The TFT substrate according to claim 11, wherein each of the plurality of connecting wire groups comprises at least one connecting wire that is not electrically coupled to any of the plurality of common electrodes.

* * * * *